United States Patent [19]

Mader

[11] Patent Number: 5,825,223
[45] Date of Patent: Oct. 20, 1998

[54] TECHNIQUE FOR CONTROLLING THE SLOPE OF A PERIODIC WAVEFORM

[75] Inventor: Urs H. Mader, Sunnyvale, Calif.

[73] Assignee: Micro Linear Corporation, San Jose, Calif.

[21] Appl. No.: 688,375

[22] Filed: Jul. 30, 1996

[51] Int. Cl.$^6$ .................................................. H03K 5/123
[52] U.S. Cl. ..................... 327/170; 3327/134; 3327/336; 3327/345
[58] Field of Search ................................... 327/126, 127, 327/131, 132, 134–137, 170, 336, 345, 91, 94, 96

[56] References Cited

U.S. PATENT DOCUMENTS

| | | | |
|---|---|---|---|
| 3,671,782 | 6/1972 | Witlinger et al. | 327/96 |
| 3,723,891 | 3/1973 | Whiteley | 329/103 |
| 3,828,203 | 8/1974 | Belson et al. | 327/137 |
| 3,893,036 | 7/1975 | Cavoretto et al. | 327/136 |
| 4,031,449 | 6/1977 | Trombly | 320/2 |
| 4,038,625 | 7/1977 | Tompkins et al. | 336/83 |
| 4,063,108 | 12/1977 | Klett et al. | 307/64 |
| 4,127,795 | 11/1978 | Knoll | 315/210 |
| 4,144,462 | 3/1979 | Sieron et al. | 307/66 |
| 4,145,592 | 3/1979 | Mizukawa et al. | 219/10.49 R |
| 4,146,857 | 3/1979 | Schleupen | 336/83 |
| 4,172,981 | 10/1979 | Smith | 307/66 |
| 4,207,498 | 6/1980 | Spira et al. | 315/97 |
| 4,210,846 | 7/1980 | Capewell et al. | 315/121 |
| 4,225,825 | 9/1980 | Watts | 327/135 |
| 4,251,752 | 2/1981 | Stolz | 315/206 |
| 4,260,943 | 4/1981 | Zaderej et al. | 320/21 |
| 4,277,726 | 7/1981 | Burke | 315/98 |
| 4,277,728 | 7/1981 | Stevens | 315/307 |
| 4,297,614 | 10/1981 | Chandler | 315/86 |
| 4,303,902 | 12/1981 | Lesster et al. | 336/83 |
| 4,318,608 | 3/1982 | Payne | 355/3 CH |
| 4,390,844 | 6/1983 | Ting | 327/345 |
| 4,412,265 | 10/1983 | Buuck | 361/18 |
| 4,414,493 | 11/1983 | Henrich | 315/308 |
| 4,441,053 | 4/1984 | Daspit | 315/206 |
| 4,441,054 | 4/1984 | Bay | 315/219 |
| 4,453,109 | 6/1984 | Stupp et al. | 315/219 |
| 4,486,689 | 12/1984 | Davis et al. | 315/92 |
| 4,495,446 | 1/1985 | Brown et al. | 315/206 |
| 4,496,896 | 1/1985 | Melocik et al. | 320/2 |
| 4,498,031 | 2/1985 | Stupp et al. | 315/307 |
| 4,523,131 | 6/1985 | Zansky | 315/307 |
| 4,528,482 | 7/1985 | Merlo | 315/291 |

(List continued on next page.)

OTHER PUBLICATIONS

Micro Linear, "Applications Note 24", p. 3.
Micro Linear, "Advance Information ML–4830 Electronic Ballast Controller", Jun. 1992.
Micro Linear, "Advance Information ML–4830 Electronic Ballast Controller", Jul. 1992.

*Primary Examiner*—Toan Tran
*Attorney, Agent, or Firm*—Haverstock & Owens LLP

[57] ABSTRACT

A circuit for forming a substantially periodic signal having a linear relationship between amplitude and time over a portion of its period, wherein a slope in the linear portion is controllable. A transconductance amplifier has a gain which is controllable depending upon a level of biasing current. A capacitor is coupled to an output of the transconductance amplifier wherein a voltage level on the capacitor defines the periodic waveform. Logic signals coupled to inputs to the transconductance amplifier control a direction of current flow from the transconductance amplifier to charge and discharge the capacitor. The biasing current is controllable to control a slope of the periodic waveform. In the preferred embodiment, the invention is used in conjunction with a circuit for forming pulses centered about positive zero crossings of a sinusoidal signal. The biasing current to the transconductance amplifier has two components. A first component of the biasing current is constantly supplied and a second component of the biasing current is selectively supplied. Therefore, the slope of the waveform may have one of two values depending upon whether or not the second component of the biasing current is selected to increase the biasing current of the transconductance amplifier.

31 Claims, 5 Drawing Sheets

U.S. PATENT DOCUMENTS

| | | | |
|---|---|---|---|
| 4,543,556 | 9/1985 | Taylor et al. | 336/210 |
| 4,572,988 | 2/1986 | Handler et al. | 315/209 R |
| 4,585,974 | 4/1986 | Stupp et al. | 315/307 |
| 4,604,552 | 8/1986 | Alley et al. | 315/176 |
| 4,612,479 | 9/1986 | Zansky | 315/194 |
| 4,654,573 | 3/1987 | Rough et al. | 320/2 |
| 4,686,427 | 8/1987 | Burke | 315/219 |
| 4,698,554 | 10/1987 | Stupp et al. | 315/307 |
| 4,700,113 | 10/1987 | Stupp et al. | 315/224 |
| 4,704,563 | 11/1987 | Hussey | 315/307 |
| 4,717,863 | 1/1988 | Zeiler | 315/307 |
| 4,723,098 | 2/1988 | Grubbs | 315/306 |
| 4,739,227 | 4/1988 | Anderson | 315/260 |
| 4,763,239 | 8/1988 | Ball | 363/98 |
| 4,800,328 | 1/1989 | Bolger et al. | 320/2 |
| 4,806,880 | 2/1989 | Laws | 331/8 |
| 4,874,989 | 10/1989 | Nilssen | 315/151 |
| 4,893,059 | 1/1990 | Nilssen | 315/127 |
| 4,896,077 | 1/1990 | Dodd et al. | 315/289 |
| 4,920,299 | 4/1990 | Presz et al. | 315/98 |
| 4,935,669 | 6/1990 | Nilssen | 315/105 |
| 4,942,352 | 7/1990 | Sano | 320/2 |
| 4,952,849 | 8/1990 | Fellows et al. | 315/307 |
| 4,962,344 | 10/1990 | Bohrer | 307/260 |
| 5,015,919 | 5/1991 | Vila-Masot et al. | 315/86 |
| 5,045,732 | 9/1991 | Sugiura et al. | 307/529 |
| 5,048,033 | 9/1991 | Donahue et al. | 372/38 |
| 5,049,790 | 9/1991 | Herfurth et al. | 315/291 |
| 5,111,118 | 5/1992 | Fellows et al. | 315/307 |
| 5,177,408 | 1/1993 | Marques | 315/291 |
| 5,202,608 | 4/1993 | Johnson | 315/86 |
| 5,214,352 | 5/1993 | Love | 315/86 |
| 5,216,402 | 6/1993 | Carosa | 336/66 |
| 5,237,242 | 8/1993 | Takahashi et al. | 315/123 |
| 5,264,776 | 11/1993 | Hulsey | 320/2 |
| 5,363,020 | 11/1994 | Chen et al. | 315/209 R |
| 5,367,223 | 11/1994 | Eccher | 315/97 |
| 5,367,224 | 11/1994 | Pacholok | 315/219 |
| 5,367,242 | 11/1994 | Hulman | 320/2 |
| 5,384,516 | 1/1995 | Kawabata et al. | 315/160 |
| 5,394,020 | 2/1995 | Nienaber | 327/134 |
| 5,408,162 | 4/1995 | Williams | 315/224 |
| 5,410,188 | 4/1995 | Segaram | 327/237 |
| 5,410,221 | 4/1995 | Mattas et al. | 315/307 |
| 5,642,066 | 6/1997 | Burke | 327/134 |

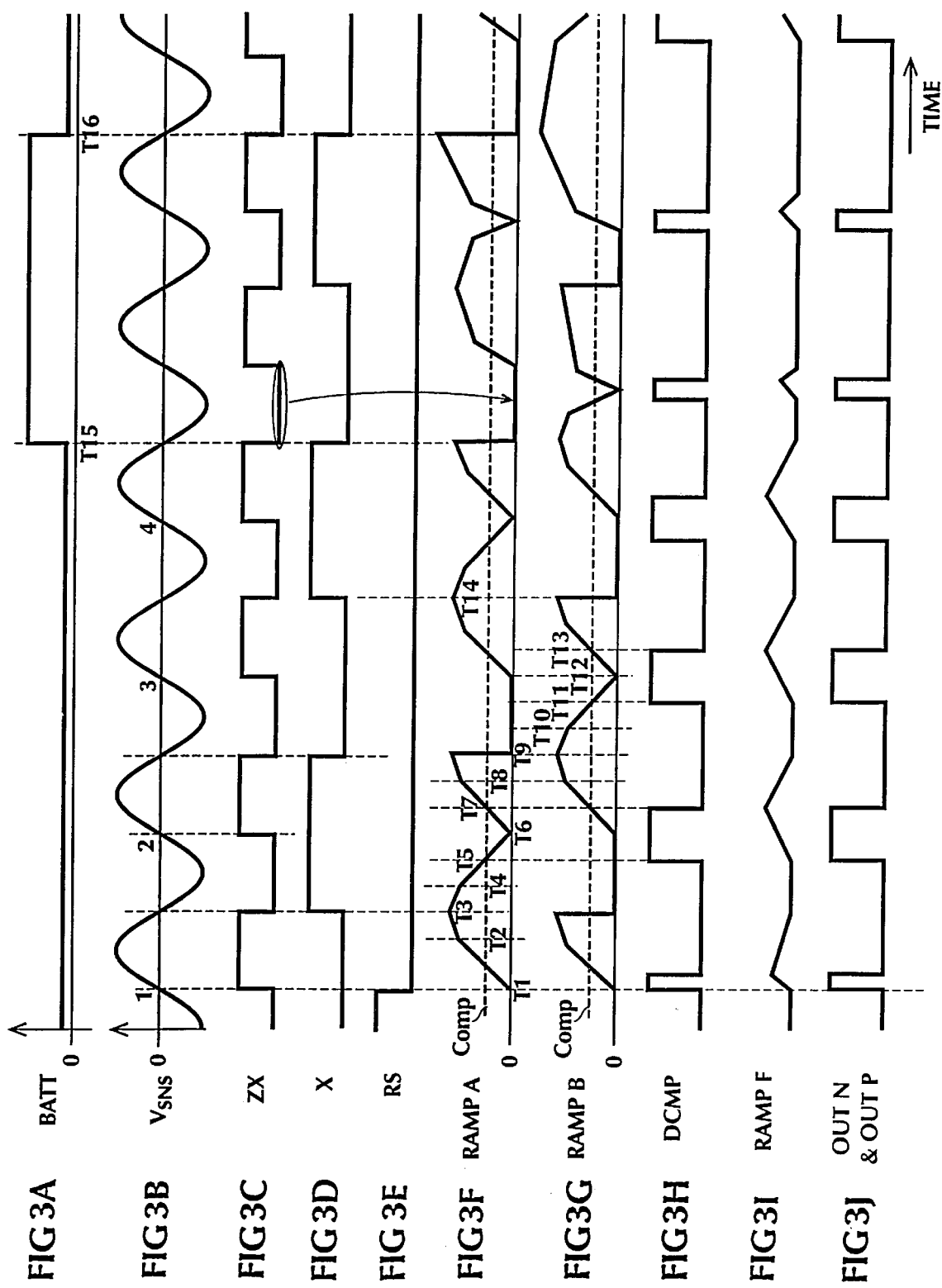

TECHNIQUE FOR CONTROLLING THE SLOPE OF A PERIODIC WAVEFORM

FIELD OF THE INVENTION

The invention relates to the field of circuits for forming periodic waveforms. In particular, the invention relates to circuits for forming periodic waveforms having an ability to selectively control a slope of a linear portion of the waveform.

BACKGROUND OF THE INVENTION

Periodic waveforms such as triangle and sawtooth waveforms are commonly utilized in electronic devices. These waveforms generally exhibit a linear relationship between amplitude and time over some portion of their period. This linear relationship has many applications in electronic circuits. For example, the linear relationship may be utilized for making time measurements of signals, for time based signal modulation, or for other time based circuit functions.

An example of a periodic waveform having a linear relationship between amplitude and time over a portion of its period is described in co-pending U.S. patent application Ser. No. 08/688,561, filed Jul. 30, 1996 which describes a circuit that forms a square wave pulse train signal wherein each pulse is centered about a zero crossing of a sinusoidal signal. A triangle waveform is formed having valleys that coincide with positive zero crossings of the sinusoidal signal. The triangle waveform is then compared by a comparator circuit to a controllable reference voltage level. The output of the comparator circuit is a square wave pulse train wherein each pulse is centered about a positive zero crossing of the sinusoidal signal. The width of the generated pulses is controllable by changing the reference voltage level. The period of the triangle waveform is related to the period of the sinusoidal signal and the maximum amplitude of the triangle waveform is limited by the supply voltage.

Other periodic waveforms having a linear relationship between amplitude and time suffer from a similar constraint in that the slope of the linear portions of the waveform cannot be well controlled because the slope is dictated by the period of the waveform and the maximum available amplitude.

Therefore, what is needed is a technique for controlling the slope of a periodic waveform wherein the slope is controllable independently of the period and maximum available amplitude.

SUMMARY OF THE INVENTION

The invention is a circuit for forming a substantially periodic signal having a linear relationship between amplitude and time over a portion of its period, wherein a slope in the linear portion is controllable. A transconductance amplifier has a gain which is controllable depending upon a level of biasing current. A capacitor is coupled to an output of the transconductance amplifier wherein a voltage level on the capacitor defines the periodic waveform. Logic signals coupled to inputs to the transconductance amplifier control a direction of current flow from the transconductance amplifier to charge and discharge the capacitor. The biasing current is controllable to control a slope of the periodic waveform.

In the preferred embodiment, the invention is used in conjunction with a circuit for forming pulses centered about positive zero crossings of a sinusoidal signal. The biasing current to the transconductance amplifier has two components. A first component of the biasing current is constantly supplied and a second component of the biasing current is selectively supplied. Therefore, the slope of the waveform may have one of two values depending upon whether or not the second component of the biasing current is selected to increase the gain of the transconductance amplifier.

Upon a first positive zero crossing of the reference sinusoid, logic coupled to the inputs to the transconductance amplifier causes the transconductance amplifier to begin charging the capacitor. The second biasing current is selected so that the transconductance amplifier begins charging the capacitor at the higher of the two rates. Thus, a first positive slope is defined. Upon the capacitor voltage reaching a predetermined level, the second component of the biasing current is no longer provided whereby the transconductance amplifier continues to charge the capacitor, but at the lower of the two rates. Thus, a second positive slope is defined. Upon a first negative zero crossing of the reference sinusoid, the logic coupled to the inputs of the transconductance amplifier causes the transconductance amplifier to begin discharging the capacitor. The capacitor is discharged at the lower of the two rates whereby a first negative slope is defined. Upon the capacitor voltage reaching the predetermined voltage level, the second component of the biasing current is selected to increase the gain of the transconductance amplifier whereby the transconductance amplifier begins to discharge the capacitor at the higher of the two rates. Thus, a second negative slope is defined.

Once the capacitor voltage reaches a second predetermined voltage level, the transconductance amplifier, still biased with the second component of the biasing current, begins charging the capacitor again at the higher of the two rates. A valley is defined in the capacitor voltage waveform which coincides with the second positive zero crossing of the reference sinusoid. The valley is compared by a comparator circuit to a reference voltage level to form a pulse centered about the second positive zero crossing of the reference sinusoid.

In the preferred embodiment, the level of the first component of the biasing current also depends upon a level of a supply voltage. Thus, if the supply voltage drops, as occurs when a battery supply begins to be depleted, the slope may be controlled so that the centered pulse is wider to compensate for the lower supply voltage level.

BRIEF DESCRIPTION OF THE DRAWINGS

FIGS. 3A–3J show timing diagrams for signals of the circuits shown in FIGS. 1 and 2.

DETAILED DESCRIPTION OF THE PREFERRED EMBODIMENT

Figure 1A:
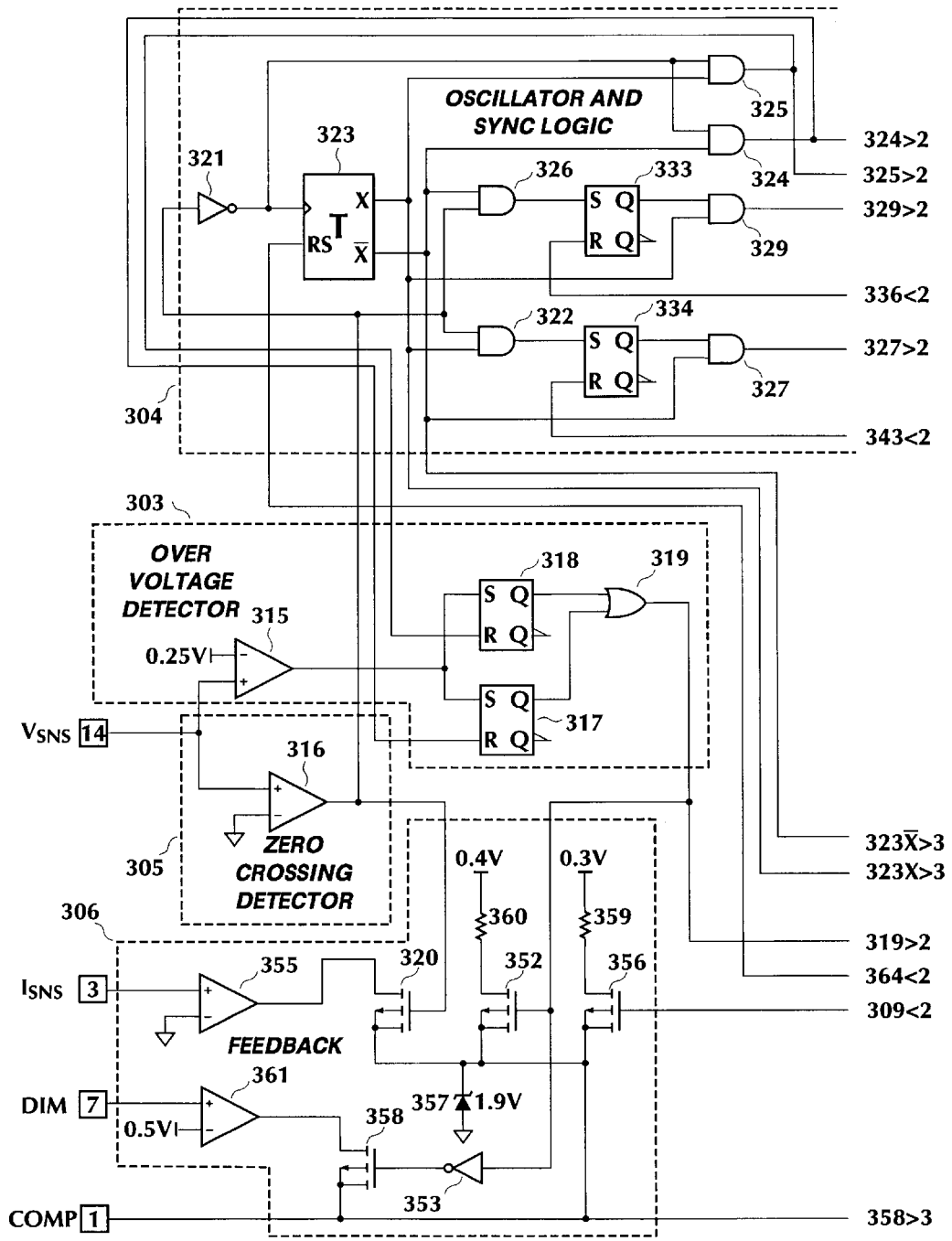
FIG. 1 shows a schematic diagram of a controller circuit of the present invention.

Referring to FIG. 1, a controller 300 of the present invention is shown. The present invention comprises a portion of the controller 300, however, the entire controller 300 is shown for illustrative purposes. The controller 300 preferably comprises an integrated circuit chip, but could be constructed from discrete components. Further, the controller 300 is preferably an integrated circuit chip controller available from Micro Linear Corporation, located at 2092 Concourse Drive, in San Jose, Calif., zip code 95131, under part number ML4878.

The controller comprises a minimum frequency bias circuit 301, a feed forward biasing circuit 302, an over voltage detector circuit 303, an oscillator and sync logic circuit 304, a zero crossing detector circuit 305, a feedback circuit 306, a linear regulator circuit 307, a bias & bandgap reference circuit 308, a negative edge delay circuit 309, a lamp out detector circuit 310, a duty cycle comparator circuit 311, a 50% duty cycle limit circuit 312, a dead time logic circuit 313 and a high side drive correction circuit 314. The controller also comprises a COMP pin 1, a CTLO pin 2, an ISNS pin 3, an RR pin 4, an RT pin 5, an ON/OFF pin 6, a DIM pin 7, a BATT pin 8, an OUTP pin 9, a VCC pin 10, an OUTN pin 11, a GND pin 12, a CHSC pin 13, and a VSNS pin 14.

The VSNS pin 14 is coupled to a non-inverting input to a comparator 315 and to a non-inverting input to a comparator 316. An inverting input to the comparator 315 is coupled to a voltage source of 0.25 volts. An inverting input to the comparator 316 is coupled to the ground node. An output of the comparator 315 is coupled to an S input to an R-S flip-flop 317 and to an S input to an R-S flip-flop 318. A Q output of the flip-flop 317 is coupled to a first input to an OR gate 319. A Q output of the flip-flop 318 is coupled a second input to the OR gate 319.

An output of the comparator 316 is coupled to a gate of an NMOSFET 320, to an input to an inverter 321, and to a first input to an AND gate 322. An output of the inverter 321 is coupled to a clock input to a T flip-flop 323, to a first input to an AND gate 324, and to a first input to an AND gate 325. An X-not output of the T flip-flop 323 is coupled to a second input to the AND gate 324, to a first input to an AND gate 326, to a first input to an AND gate 327, and to a first input to an AND gate 328. The output of the comparator 316 is also coupled to a second input to the AND gate 326. An X output of the T flip flop 323 is coupled to a second input to the AND gate 325, to a first input to an AND gate 329, to a second input to the AND gate 322, and to a first input to an AND gate 330.

An output of the AND gate 325 is coupled to an R input to the R-S flip-flop 318 and to a gate of an NMOSFET 331. An output of the AND gate 324 is coupled to an R input to the R-S flip-flop 317 and to a gate of an NMOSFET 332. An output of the AND gate 326 is coupled to an S input to an R-S flip-flop 333. A Q output of the R-S flip-flop 333 is coupled to a second input to the AND gate 329. An output of the AND gate 322 is coupled to an S input to an R-S flip-flop 334. A Q output of the R-S flip-flop 334 is coupled to a second input to the AND gate 327.

An output of the AND gate 329 is coupled to an inverting input to a transconductance amplifier 335. A non-inverting input to the transconductance amplifier 335 is coupled to a voltage source of 2.5 volts. An output of the transconductance amplifier 335 is coupled to an inverting input to a comparator 336, to a first terminal of a capacitor 337, to a drain of the NMOSFET 331, to an inverting input to a transconductance amplifier 338, and to an inverting input to a comparator 339. A second terminal of the capacitor 337 is coupled to a source of the NMOSFET 331 and to the ground node. A non-inverting input to the comparator 336 is coupled to a voltage source of 0.3 volts. An output of the comparator 336 is coupled to an R input to the R-S flip-flop 333. A non-inverting input to the transconductance amplifier 338 is coupled to a voltage source of 1.9 volts. An output of the transconductance amplifier 338 is coupled to an anode of a diode 340. A cathode of the diode 340 and a first terminal of a current mirror 341 are coupled to the transconductance amplifier 335 to control the gain of the transconductance amplifier 335.

An output of the AND gate 327 is coupled to an inverting input to a transconductance amplifier 342. A non-inverting input to the transconductance amplifier 342 is coupled to a voltage source of 2.5 volts. An output of the transconductance amplifier 342 is coupled to an inverting input to a comparator 343, to a first terminal of a capacitor 344, to a drain of the NMOSFET 332, to an inverting input to a transconductance amplifier 345, and to an inverting input to a comparator 346. A second terminal of the capacitor 344 is coupled to a source of the NMOSFET 332 and to the ground node. A non-inverting input to the comparator 343 is coupled to a voltage source of 0.3 volts. An output of the comparator 343 is coupled to an R input to the R-S flip-flop 334. A non-inverting input to the transconductance amplifier 345 is coupled to a voltage source of 1.9 volts. An output of the transconductance amplifier 345 is coupled to an anode of a diode 347. A cathode of the diode 347 and a second terminal of a current mirror 341 are coupled to the transconductance amplifier 342 to control the gain of the transconductance amplifier 342.

A third terminal of the current mirror 341 is coupled to a collector of an npn bipolar transistor 348. An emitter of the bipolar transistor 348 is coupled to an inverting input to a amplifier 349 and to the RT pin 5. A non-inverting input to the amplifier 349 is coupled to a voltage source of 2 volts. An output of the amplifier 349 is coupled to a base of the bipolar transistor 348. A fourth terminal of the current mirror 341 is coupled to a first terminal of a current mirror 350 and to a first terminal of a current mirror 351. A second terminal of the current mirror 350 is coupled to the RR pin 4. A third terminal of the current mirror 350 is coupled to the ground node. A second terminal of the current mirror 351 is coupled to control the gain of the transconductance amplifier 338. A third terminal of the current mirror 351 is coupled to control the gain of the transconductance amplifier 345.

An output of the OR gate 319 is coupled to a gate of an NMOSFET 352, to an input to an inverter 353, and to a first input to an OR gate 354. The ISNS pin 3 is coupled to a non-inverting input to a transconductance amplifier 355. An inverting input to the transconductance amplifier 355 is coupled to the ground node. An output of the transconductance amplifier 355 is coupled to a drain of the NMOSFET 320. A source of the NMOSFET 320 is coupled to a source of the NMOSFET 352, to a source of an NMOSFET 356, to a cathode of a 1.9 volt Zener diode 357, to a source of an NMOSFET 358, to a non-inverting input to the comparator 339, to a non-inverting input to the comparator 346, and to the COMP pin 1. An anode of the diode 357 is coupled to the ground node. A drain of the NMOSFET 356 is coupled to a first terminal of a 5 kohms resistor 359. A second terminal of the resistor 359 is coupled to a voltage source of 0.3 volts. A drain of the NMOSFET 352 is coupled to a first terminal of a 100 kohms resistor 360. A second terminal of the resistor 360 is coupled to a voltage source of 0.4 volts.

An output of the inverter 353 is coupled to a gate of the NMOSFET 358. The DIM pin 7 is coupled to a non-inverting input to a transconductance amplifier 361. An inverting input to the transconductance amplifier 361 is coupled to a voltage source of 0.5 volts. An output of the transconductance amplifier 361 is coupled to a drain of the NMOSFET 358. The ON/OFF pin 6 is coupled to an input to a buffer 362. An output of the buffer 362 is coupled to an ON input to the linear regulator 307, and to an ON input to the bias & bandgap reference circuit 308. The BATT pin 8 is coupled to supply power to the linear regulator 307. The VCC pin 10 is coupled to the linear regulator 307. A REF terminal of the linear regulator is coupled to a REF terminal of the bias & bandgap reference circuit 308. An output UV of the bias & and bandgap reference circuit 308 is coupled to an input to the 40 us negative edge delay circuit 309.

An output of the negative edge delay circuit 309 is coupled to a gate of the NMOSFET 356, to a gate of an NMOSFET 363, to a first input to an AND gate 364, to a first inverted input to an AND gate 365, and to a first input to an OR gate 366. A drain of the NMOSFET 363 is coupled a non-inverting input to a comparator 367, to an output of a transconductance amplifier 368, and to the CTLO pin 2. A source of the NMOSFET 363 is coupled to the ground node. An inverting input to the comparator 367 is coupled to a voltage source of 3 volts. An output of the comparator 367 is coupled to a second input to the AND gate 364 and to a second input to the OR gate 354. An output of the OR gate 354 is coupled to a non-inverting input to the transconductance amplifier 368. An inverting input to the transconductance amplifier 368 is coupled to a voltage source of 2.5 volts. The transconductance amplifier is biased with a current of 1 uA.

An output of the AND gate 364 is coupled to an RS input to the flip-flop 323 and to a first inverting input to an AND gate 369. An output of the comparator 339 is coupled to a second input to the AND gate 330. An output of the comparator 346 is coupled to a second input to the AND gate 328. An output of the AND gate 330 is coupled to a first input to an OR gate 370. An output of the AND gate 328 is coupled a second input to the OR gate 370. An output of the OR gate 370 is coupled to an S input to an R-S flip-flop 371 and to a second input to the AND gate 369. A Q output of the flip-flop 371 is coupled to a third input to the AND gate 369. An output of the AND gate 369 is coupled to a second input to the AND gate 365 and to a non-inverting input to a transconductance amplifier 372. An inverting input to the transconductance amplifier 372 is coupled to a voltage source of 2.5 volts. A fifth terminal of the current mirror 341 is coupled to control the gain of the transconductance amplifier 372.

An output of the transconductance amplifier 372 is coupled to a first terminal of a capacitor 373 and to a non-inverting input to a comparator 374. A second terminal of the capacitor 373 is coupled to the ground node. An inverting input to the comparator 374 is coupled to the ground node. An output of the comparator 374 is coupled to an R input to the flip-flop 371. An output of the AND gate 365 is coupled to a first input to an OR gate 375. An output of the OR gate 375 is coupled to an input to a 100 ns delay circuit 376, to a first input to a NAND gate 377, and to a second input to the NOR gate 366. An output of the delay circuit 376 is coupled to a second input to the NAND gate 377 and to a third input to the NOR gate 366.

An output of the NOR gate 366 is coupled to an input to a buffer 378. An output of the buffer 378 is coupled to the OUTN pin 11. An output of the NAND gate 377 is coupled to an input to a buffer 379. An output of the buffer 379 is coupled to the OUTP pin 9 and to an input to an inverter 380. An output of the inverter 380 is coupled to a gate of an NMOSFET 381. A source of the NMOSFET 381 is coupled to the ground node. A drain of the NMOSFET 382 is coupled to the CHSC pin 13, to a cathode of a 2.1 volt Zener diode 382, and to a non-inverting input to a comparator 383. An inverting input to the comparator 383 is coupled a voltage source of 1.4 volts. An output of the comparator 383 is coupled to an input to a 200 ns positive edge delay circuit 384. An output of the positive edge delay circuit 384 is coupled to a second input to the OR gate 375. An anode of the diode 382 is coupled to the ground node. The GND pin 12 is coupled to the ground node.

Figure 1B:
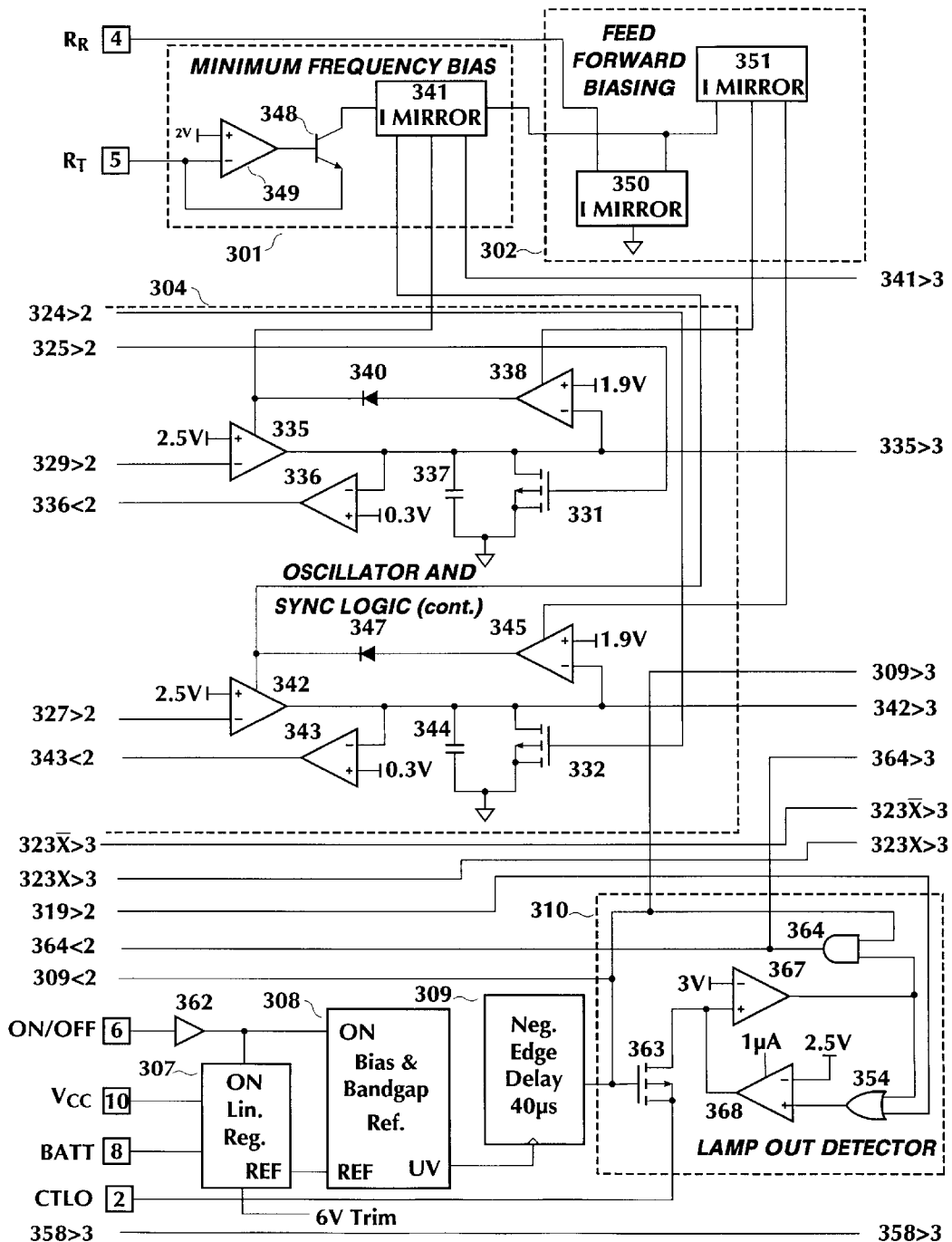
Figure 1C:
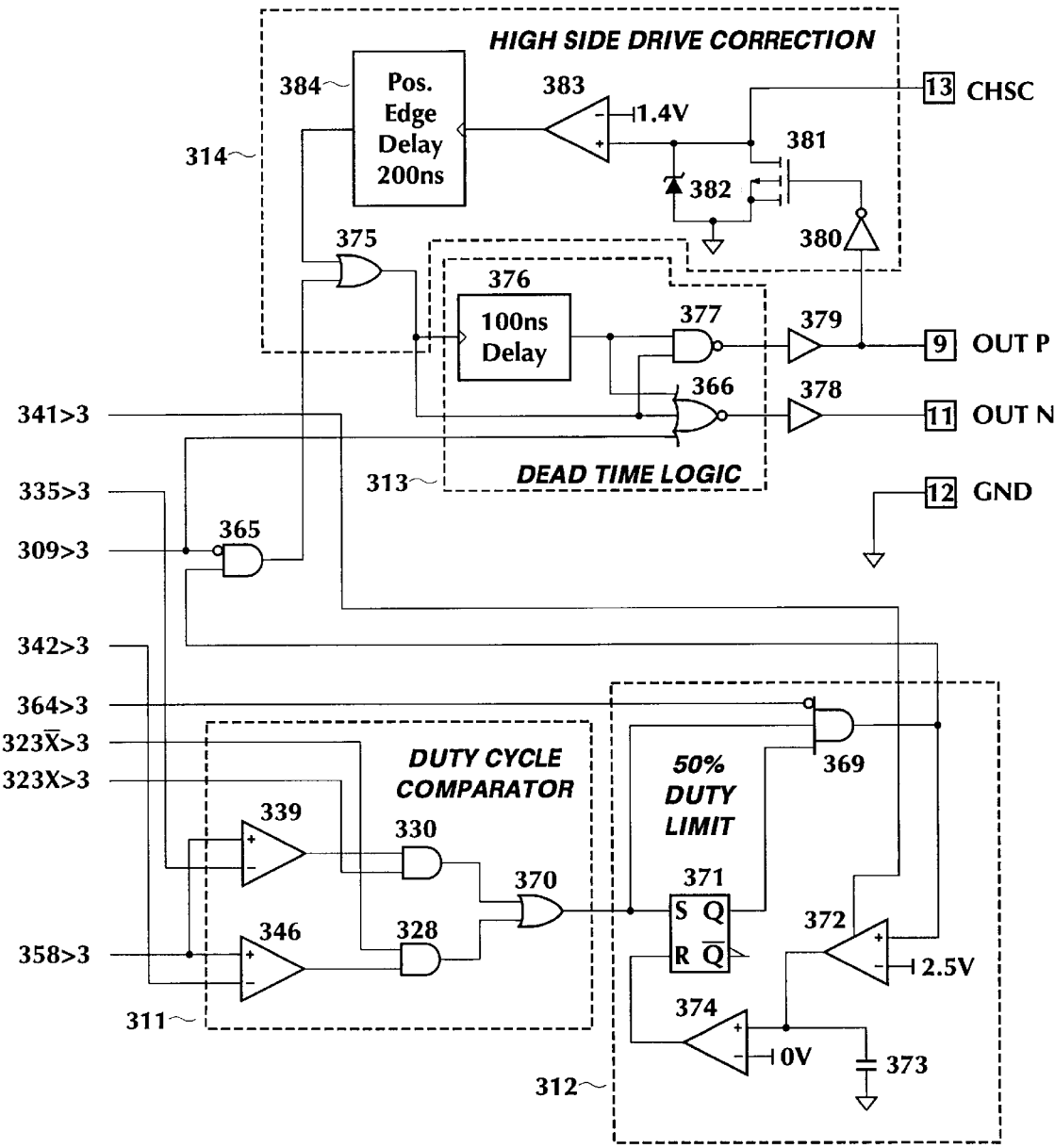
Figure 2:
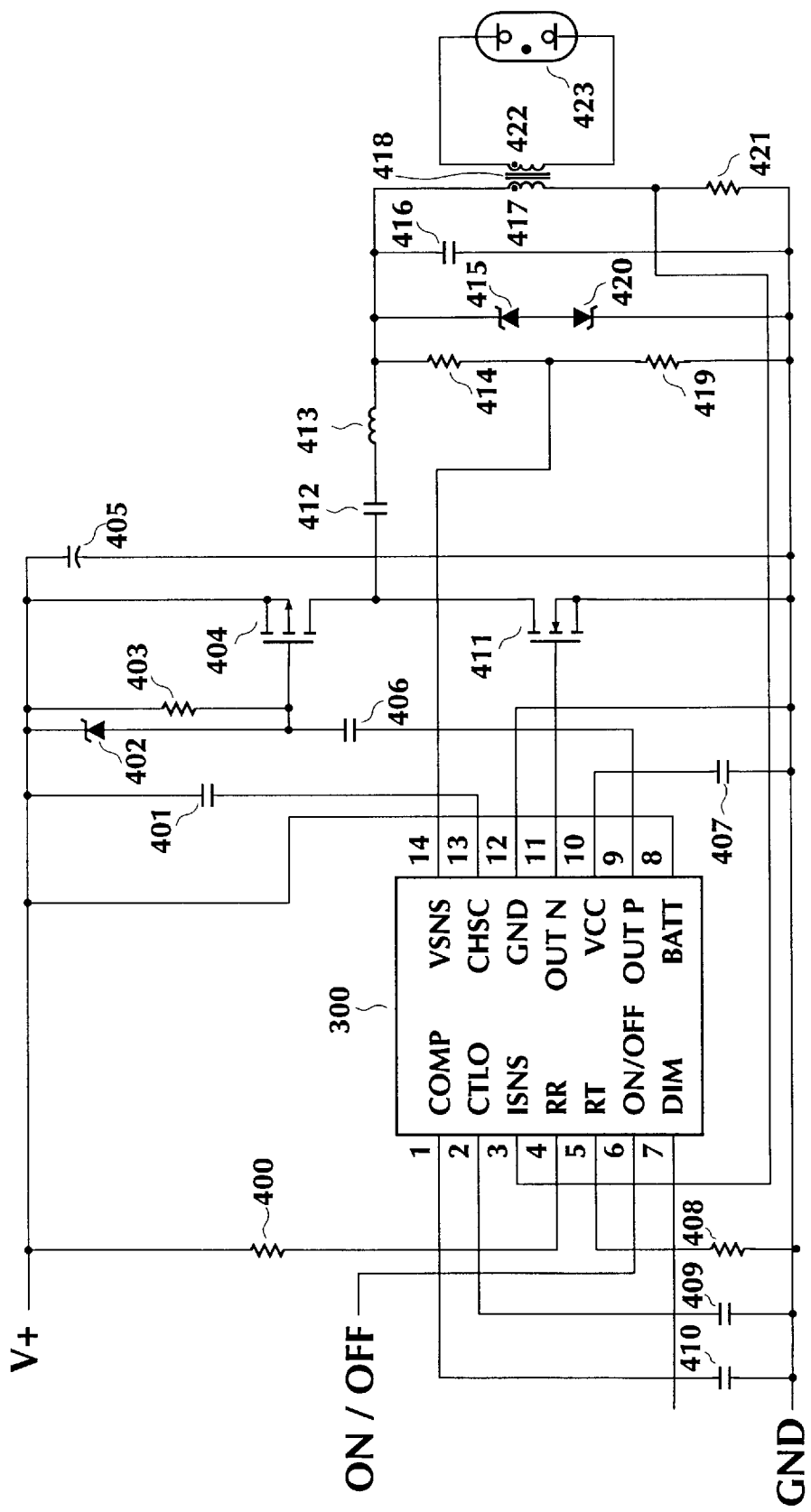
FIG. 2 shows a schematic diagram of circuits external to the controller circuit of the present invention.
Figure 1B:
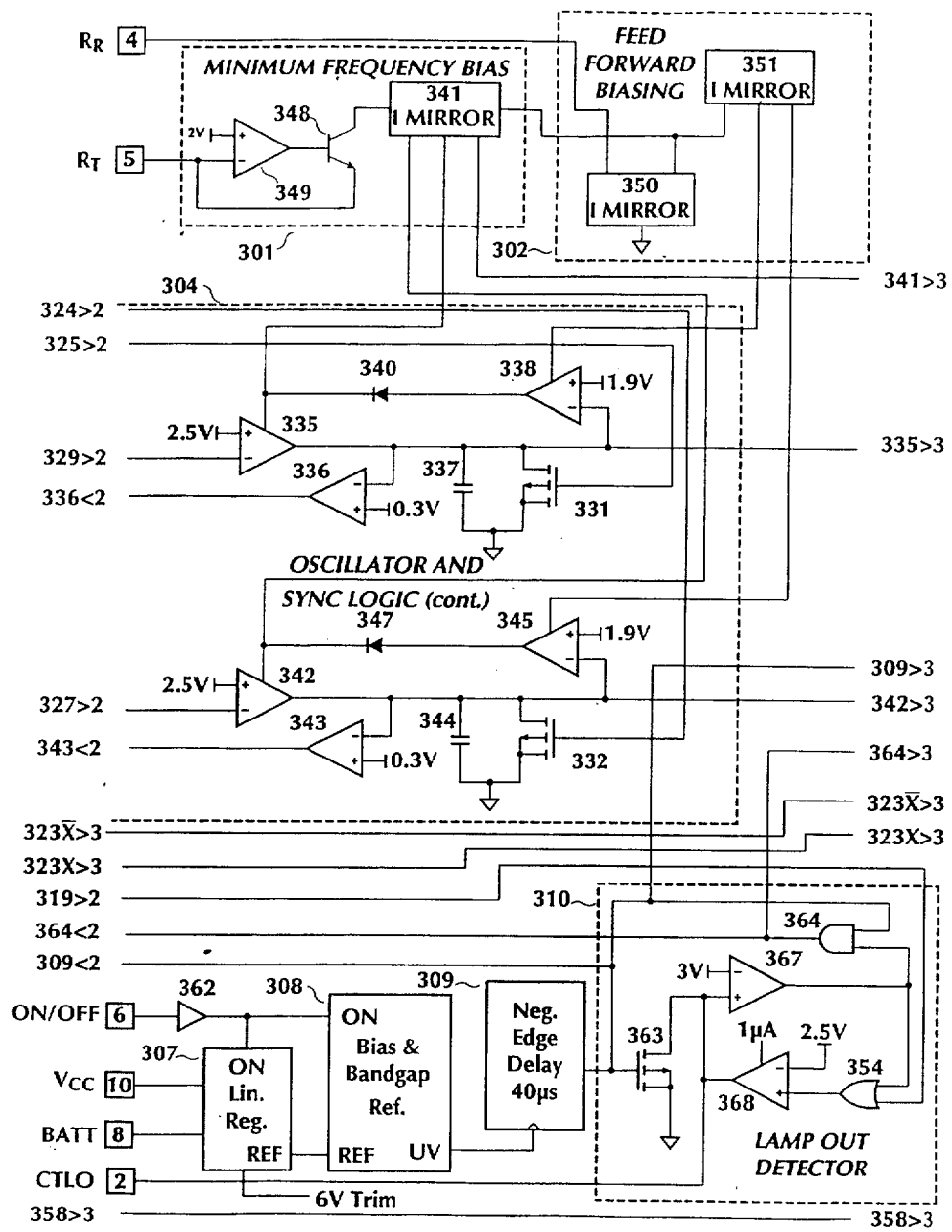

FIG. 2 shows a schematic diagram of circuits external to the controller chip 300 of FIG. 1. Referring to FIG. 2, a voltage supply V+, such as a battery, is coupled to the BATT pin 8 of the controller 300, to a first terminal of a resistor 400, to a first terminal of a capacitor 401, to a cathode of a Zener diode 402, to a first terminal of a resistor 403, to a source of a PMOSFET 404 and to a first terminal of a capacitor 405. A second terminal of the resistor 400 is coupled to the RR pin 4 of the controller 300. A second terminal of the capacitor 401 is coupled to the CHSC pin 13 of the controller 300. An anode of the Zener diode 402 is coupled to a second terminal of the resistor 403, to a gate of the PMOSFET 404, and to a first terminal of a capacitor 406. A second terminal of the capacitor 406 is coupled to the OUTP pin 9 of the controller 300. A second terminal of the capacitor 405 is coupled to the ground node.

The DIM pin 7 of the controller 300 is coupled to be controlled by an external circuit for dimming the lamp. The VCC pin 10 of the controller 300 is coupled to a first terminal of a capacitor 407. A second terminal of the capacitor 407 is coupled to the ground node. The RT pin 5 of the controller 300 is coupled to a first terminal of a resistor 408. A second terminal of the resistor 408 is coupled to the ground node. The CTLO pin 2 of the controller 300 is coupled to a first terminal of a capacitor 409. A second terminal of the capacitor 409 is coupled to the ground node. The COMP pin 1 of the controller 300 is coupled to a first terminal of a capacitor 410. A second terminal of the capacitor 410 is coupled to the ground node.

The GND pin 12 of the controller 300 is coupled to the ground node. The ON/OFF pin 6 of the controller 300 is coupled to be controlled by an external circuit for turning the lamp on or off. The OUTN pin 11 of the controller 300 is coupled to a gate of an NMOSFET 411. A drain of the NMOSFET 411 is coupled to a drain of the PMOSFET 404 and to a first terminal of a capacitor 412. A source of the NMOSFET 411 is coupled to the ground node. A second terminal of the capacitor 412 is coupled to a first terminal of an inductor 413. A second terminal of the inductor 413 is coupled to a first terminal of a resistor 414, to a cathode of a Zener diode 415, to a first terminal of a capacitor 416, and to a first terminal of a primary winding 417 of a transformer 418. According to the "dot convention" for determining transformer winding polarities, the first terminal of the primary winding 417 is designated with a dot.

A second terminal of the resistor 414 is coupled to a VSNS pin 14 of the controller 300 and to a first terminal of a resistor 419. A second terminal of the resistor 419 is coupled to the ground node. An anode of the Zener diode 415 is coupled to an anode of a Zener diode 420. A cathode of the Zener diode 420 is coupled to the ground node. A second terminal of the capacitor 416 is coupled to the ground node. A second terminal of the primary winding 417 is coupled to a first terminal of a resistor 421 and to the ISNS pin 3 of the controller 300. A second terminal of the resistor 421 is coupled to the ground node.

A first terminal of a secondary winding 422 of the transformer 418 is coupled to a first terminal of a cold cathode fluorescent lamp 423. According to the "dot convention," the first terminal of the secondary winding 422 is designated with a dot. A second terminal of the secondary winding 422 is coupled to a second terminal of the fluorescent lamp 423.

FIG. 3 shows a timing diagram for signals of the circuit shown in FIGS. 1 and 2. Referring to FIG. 3, BATT is the input signal to the BATT pin 8 of the controller 300 as shown in FIG. 2. VSNS is representative of the signal applied to the fluorescent lamp 423 shown in FIG. 2 and is the signal applied to the VSNS pin 14 of the controller 300 shown in FIGS. 1 and 2. An object of the invention is to drive a lamp with a resonant circuit at its resonant frequency by inputting pulses to the resonant circuit wherein the pulses are centered about a zero crossing of the lamp signal VSNS. ZX is the signal at the output of the comparator 316 of FIG. 1. The comparator 316 serves as a zero crossing detector for the signal VSNS applied to the lamp 423. The signal ZX is at a logical high voltage level when the signal VSNS is above zero volts and at a logical low voltage level when the signal VSNS is below zero volts. The X signal of FIG. 3 is obtained by the logic circuits coupled to the output of the comparator 316. The RAMPA signal of FIG. 3 is the voltage across the capacitor 337 of FIG. 1. The RAMPB signal of FIG. 3 is the voltage across the capacitor 344 of FIG. 1.

The DCMP signal is representative of the centered pulse signal used to drive the resonant lamp circuit. The DCMP signal is formed by logic of the duty cycle compare circuit 311 and the oscillator and sync logic circuit 304 which combines the outputs of the comparator 339 and the comparator 346 such that the pulses in the DCMP signal are alternately formed by the RAMPA comparison and the RAMPB comparison, as described above. This is effected by the X and X-not outputs of the flip-flop 323 which are coupled to the AND gates 330 and 328.

Referring to FIG. 3, the RAMPA signal, having been discharged by transistor 331, and thereby initialized begins at zero volts prior to a first positive zero crossing 1 of the VSNS signal. When the first positive zero crossing 1 of the VSNS signal is reached, at approximately the time T1, as detected by the comparator 316, the logic circuits of the oscillator and sync logic circuit 304 of FIG. 1 cause the transconductance amplifier 335 to begin charging the capacitor 337 at a rate determined by the biasing signal to the transconductance amplifier 335. At the next negative zero crossing of the VSNS signal, at the time T3, the logic circuits of the oscillator and sync logic circuit 304 cause the capacitor 337 to begin discharging at the same rate that it was charged. When the voltage on the capacitor 337 reaches zero (actually 0.3 volts as determined by the voltage at the non-inverting input to the comparator 336), at the time T6, the logic circuits of the oscillator and sync logic circuit 304 stop discharging the capacitor 337 and begin charging the capacitor 337.

The RAMPA signal, which represents the voltage stored on the capacitor 337, is compared by the comparator 339 of FIG. 1 to a voltage level on the COMP pin 1 of the controller as shown in FIG. 1. The COMP pin 1 voltage level is an error signal formed by the brightness level set on the DIM pin 7 and the feedback signal from the ISNS pin 3. This brightness signal is shown as a horizontal dotted line superimposed on the RAMPA signal of FIG. 3. The output of the comparator 339 is shown by the pulse in the DCMP signal of FIG. 3 beginning at time T5 and ending at the time T7. This pulse is centered about the zero crossing of the signal VSNS at approximately the time T6 and is used to drive the lamp resonant circuit. At the time T9, the oscillator and sync logic circuit 304 rapidly discharges the capacitor 337 through the transistor 331. The RAMPA signal then remains low until the third positive zero crossing 3 of the signal VSNS at approximately the time T12 and the cycle described above repeats.

The RAMPB signal is the voltage on the capacitor 344. Referring back to approximately the time T3, the capacitor 344 is rapidly discharged by the oscillator and sync logic circuits 304 through the transistor 332 thereby initializing the RAMPB signal. At the second positive zero crossing 2 of the signal VSNS, which occurs at approximately the time T6, the capacitor 344 begins to be charged by the transconductance amplifier 342 at a rate determined by the biasing signal to the transconductance amplifier 342. At the time T9, when the signal VSNS reaches a negative zero crossing, the capacitor 344 is discharged by the oscillator and sync logic circuit 304 at the same rate that it was charged. At the time T12, when the voltage on the capacitor 344 reaches zero (actually 0.3 volts as determined by the voltage at the non-inverting input to the comparator 343), the oscillator and sync logic circuit 304 stops discharging the capacitor 344 and begins charging the capacitor 344.

The RAMPB signal, which represents the voltage stored on the capacitor 344, is compared by the comparator 346 of FIG. 1 to a voltage on the COMP pin 1 of the controller as shown in FIG. 1. The COMP pin 1 voltage level is an error signal formed by the brightness level set on the DIM pin 7 and the feedback signal from the ISNS pin 3. This brightness signal is shown as a horizontal dotted line superimposed on the RAMPB signal of FIG. 3. The output of the comparator 346 is shown by the pulse in the DCMP signal of FIG. 3 beginning at time T11 and ending at the time T13. This pulse is centered about the zero crossing of the signal VSNS at approximately the time T12 and is used to drive the lamp resonant circuit. At the time T14, the oscillator and sync logic circuit 304 rapidly discharges the capacitor 344 through the transistor 331. The RAMPB signal then remains low until the fourth positive zero crossing 4 of the signal VSNS and the cycle described above repeats.

Thus, a circuit for centering pulses about a zero crossing without using a phase comparator or phase locked loop has been described. Rather, the signals RAMPA and RAMPB are synchronously interleaved to obtain the invention. Two ramp signals RAMPA and RAMPB are needed, rather than a single ramp signal, because it is not assured that the zero crossings will coincide precisely with the capacitors 339 and 344 being discharged to zero volts (0.3 volts). For this reason, the capacitors 339 and 344 are rapidly discharged at the times T9 and T14, respectively. However, it will be apparent that a single ramp signal could be used to generate all the pulses in the DCMP signal, but with reduced accuracy in centering the pulses about zero crossings of the VSNS signal.

The invention synchronizes the pulses of the DCMP signal to the sinusoidal signal VSNS within only one cycle, whereas, a phase locked loop could take longer or could fail to synchronize at all.

Referring to FIG. 3, it can be seen that the RAMPA signal changes slope at the times T2 and T4, and the RAMPB signal changes slope at the times T8 and T10. To achieve the object of centering the pulses about a zero crossing, it is important that each of the capacitors be charged and discharged at the same rates. For example, from the time T1 to the time T6, the RAMPA signal must be symmetrical about the time T3 and from the time T6 to the time T12, the RAMPB signal must be symmetrical about the time T9. As described above, the RAMPA and RAMPB signals are compared to the voltage level shown by the dotted line superimposed on the RAMPA and RAMPB signals shown in FIG. 3. Therefore, the level of the voltage on the capacitor 337 or 344 is not important so long as the voltage level on the capacitor 337 or 344 is higher than the voltage COMP represented by the dotted line and so long as the capacitors are charged and discharged at equal rates.

The rate at which the capacitor 337 is charged depends upon the bias current to the transconductance amplifier 335.

The bias current to the transconductance amplifier 335 has two components. A first component is provided by the current mirror 341. A second component is provided by the transconductance amplifier 338 through the diode 340. The diode 340 prevents current from entering the output of the transconductance amplifier 338. Similarly, the rate at which the capacitor 344 is charged depends upon the bias current to the transconductance amplifier 342. The bias current to the transconductance amplifier 342 also has two components. A first component is provided by the current mirror 341. A second component is provided by the transconductance amplifier 345 through the diode 347. The diode 347 prevents current from entering the output of the transconductance amplifier 345.

At the time T1, upon the first positive zero crossing of the signal VSNS, the output of the AND gate 329 is a logical low voltage, the voltage on the capacitor 337 is below 1.9 volts, and the transconductance amplifier 335, biased by both the current mirror 341 and the transconductance amplifier 338, charges the capacitor 337. Once the voltage on the capacitor 337 reaches 1.9 volts, at the time T2, the transconductance amplifier 338 stops providing biasing current to the transconductance amplifier 335 so that the capacitor 337 is charged at a slower rate, as shown by the reduced slope of the RAMPA circuit between the times T2 and T3. Then, once the negative zero crossing of VSNS occurs, at the time T3, the capacitor 337 is discharged at the slower rate until the capacitor 337 is discharged to below 1.9 volts. Once the capacitor 337 is discharged to below 1.9 volts, at the time T4, the transconductance amplifier 338 causes the rate at which the transconductance amplifier 335 discharges the capacitor 337 to increase again to correspond to the rate that the capacitor 337 was charged between the times T1 and T2.

Similarly, once the voltage on the capacitor 344 is above 1.9 volts, the rate at which the transconductance amplifier charges and discharges the capacitor 344 is reduced because the transconductance amplifier 345 stops providing an additional biasing current to the transconductance amplifier 342. When the voltage on the capacitor 344 is below 1.9 volts, the rate at which the transconductance amplifier 342 charges the capacitor 344 is increased because the transconductance amplifier 345 provides the additional biasing current.

A benefit of this technique is that the voltage headroom required for the signals RAMPA and RAMPB is reduced (i.e. lower supply voltage levels are required) while maintaining a relatively high gain when the RAMPA and RAMPB signals are below the 1.9 volt threshold. This relatively high gain increases the accuracy of the pulse widths and the ability to control the slope of the RAMPA and RAMPB signals increases the ability to control the pulse widths of the DCMP signal.

If voltage on the external resistor 400, illustrated in FIG. 2, increases, then current into the RR pin 4 of the controller 300 will increase, as shown in FIG. 3 by the transition in the signal BATT at the time T15 to the time T16, and the capacitors 337 and 344 will be charged even more rapidly than described above. This results in a steeper slope in the RAMPA and RAMPB signals. Thus, the pulses in the DCMP signal are narrower to reflect the reduced duty cycle required to maintain a given lamp brightness. This is achieved by the current mirrors 350 and 351 increasing the biasing current to the transconductance amplifiers 338 and 345. Thus, when the RAMPA and RAMPB signals are below 1.9 volts, the slope is increased in comparison to the slope which results when BATT is at the lower level. When the RAMPA and RAMPB signals are above 1.9 volts, the slope is the same as when BATT is at the lower level because the bias current provided by the current mirror 341 is not increased when BATT is at the higher level. Thus, another means for controlling the slope of the RAMPA and RAMPB signals is disclosed. It will be apparent that any number of different slopes which are selected based on any criteria could be employed.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiments chosen for illustration without departing from the spirit and scope of the invention.

Specifically, it will be apparent to one of ordinary skill in the art that the device of the present invention could be implemented in several different ways and the apparatus disclosed above is only illustrative of the preferred embodiment of the invention and is in no way a limitation. For example, it would be within the scope of the invention to vary the values of the various components and voltage levels disclosed herein. It will be apparent that transistors of one type, such as NMOS, PMOS, bipolar pnp or bipolar npn can be interchanged with a transistor of another type, and in some cases interchanged with diodes, with appropriate modifications, and so forth. In addition, the transconductance amplifiers of the present invention could be implemented by any type of current source. Also, a switch may be implemented with a transistor of any type. Further, the logic circuits of the oscillator and sync logic circuit 304 could be implemented in many different ways while remaining within the spirit and scope of the invention.

What is claimed is:

1. A circuit for forming a periodic waveform comprising:
  a. means for integrating a current for forming a voltage;
  b. a transconductance amplifier for forming the current coupled to the means for integrating the current;
  c. means for periodically alternating a direction of the current coupled to the transconductance amplifier;
  d. means for controlling a level of the current coupled to the transconductance amplifier; and
  e. means for sensing a level of the voltage wherein the means for controlling controls the level of the current according to the level of the voltage.

2. A circuit for forming a periodic waveform comprising:
  a. means for integrating a current for forming a voltage;
  b. a transconductance amplifier for forming the current coupled to the means for integrating the current;
  c. means for periodically alternating a direction of the current coupled to the transconductance amplifier;
  d. means for controlling a level of the current coupled to the transconductance amplifier;
  e. means for initializing the voltage.

3. The circuit according to claim 2 further comprising means for sensing a level of the voltage wherein the means for controlling controls the level of the current according to the level of the voltage.

4. A circuit for forming a periodic waveform comprising:
  a. a charge storage device wherein a voltage level on the charge storage device forms the periodic waveform;
  b. a transconductance amplifier having a first pair of differential inputs, a first biasing input and a first output, wherein the first output is coupled to the charge storage device;

c. a logic circuit for forming a logic signal coupled to a selected one of the first pair of differential inputs for controlling a direction of output current according to a level of the logic signal; and d. a biasing circuit coupled to the first biasing input for controlling a level of output current.

5. The circuit according to claim 4 wherein the charge storage device is a capacitor.

6. The circuit according to claim 4 wherein the logic circuit periodically alternates between controlling the output current to flow in a positive direction out of the transconductance amplifier and a negative direction into the transconductance amplifier.

7. The circuit according to claim 6 further comprising means for initializing the voltage level on the charge storage device.

8. The circuit according to claim 6 wherein the first pair of differential inputs comprises a first inverting input coupled to the logic circuit and a first non-inverting input coupled to receive a voltage level of approximately one half a level of a logical high voltage.

9. The circuit according to claim 8 wherein one half the level of a logical high voltage is 2.5 volts.

10. The circuit according to claim 6 wherein the biasing circuit forms a biasing current having two levels wherein the biasing current is at a first level when the voltage level on the charge storage device is below a predetermined voltage level and the biasing current is at a second level when the voltage level on the charge storage device is above the predetermined voltage level.

11. The circuit according to claim 10 wherein the predetermined level is approximately 1.9 volts.

12. The circuit according to claim 10 wherein the biasing circuit comprises means for controlling the first level of the biasing current depending upon a level of a supply voltage.

13. The circuit according to claim 10 wherein the first level of the biasing current comprises:

a. a first component wherein the first component is continuously supplied to the biasing input of the transconductance amplifier; and b. a second component wherein the second component is supplied to the biasing input of the transconductance amplifier when the voltage level on the charge storage device is below the predetermined voltage level and wherein the second component is not supplied to the biasing input to the transconductance amplifier when the voltage level on the charge storage device is above the predetermined voltage level.

14. The circuit according to claim 13 wherein the first component is supplied by a first current source coupled to the first biasing input and wherein the second component is supplied by a transconductance amplifier having a second inverting input, a second non-inverting input, a second biasing input and a second output wherein the second inverting input is coupled to receive the voltage level on the charge storage device, the second non-inverting input is coupled to the predetermined voltage level, the second biasing input is coupled to a second current source and the second output is coupled to the first biasing input through a diode.

15. A method of forming a periodic waveform comprising the steps of:

a. biasing a transconductance amplifier with a first biasing current;

b. periodically charging and discharging a capacitor with the transconductance amplifier wherein a voltage level on the capacitor forms the periodic waveform and wherein the periodic waveform has a first positive slope and a first negative slope when the transconductance amplifier is biased with the first biasing current; and c. selectively biasing the transconductance amplifier with a second biasing current wherein the periodic waveform has a second positive slope and a second negative slope when the transconductance amplifier is biased with both the first biasing current and the second biasing current.

16. The method according to claim 15 further comprising the step of altering the first biasing current depending on a level of a supply voltage.

17. The method according to claim 15 further comprising the step of initializing the voltage on the capacitor.

18. The method according to claim 15 wherein the transconductance amplifier is biased with the second biasing current only when the voltage level on the capacitor is below a predetermined level.

19. The method according to claim 18 wherein the predetermined level is approximately 1.9 volts.

20. A circuit for forming a periodic waveform comprising:

a. means for integrating a current for forming a voltage;

b. a transconductance amplifier for forming the current coupled to the means for integrating the current;

c. means for periodically alternating a direction of the current coupled to the transconductance amplifier;

d. means for controlling a level of the current coupled to the transconductance amplifier wherein the means for controlling a level of the current forms a biasing current having two levels wherein the biasing current is at a first level when the voltage on the means for integrating is below a predetermined level and the biasing current is at a second level when the voltage on the means for integrating is above the predetermined level and wherein the level of the current formed by the transconductance amplifier is responsive to the biasing current.

21. The circuit according to claim 20 wherein at least one of the two levels is adjusted according to a level of a supply voltage.

22. The circuit according to claim 4 wherein the biasing circuit forms a biasing current having two levels wherein the biasing current is at a first level when the voltage level on the charge storage device is below a predetermined voltage level and the biasing current is at a second level when the voltage level on the charge storage device is above the predetermined voltage level.

23. The circuit according to claim 22 wherein at least one of the two levels is adjusted according to a level of a supply voltage.

24. The method according to claim 17 wherein the step of initializing the voltage on the capacitor is periodically performed.

25. A circuit for forming a periodic waveform comprising:

a. means for integrating a current for forming a voltage;

b. a transconductance amplifier for forming the current coupled to the means for integrating the current;

c. a logic circuit for forming a logic signal coupled to the transconductance amplifier wherein a direction of the current is periodically alternated according to a level of the logic signal; and d. means for controlling a level of the current coupled to the transconductance amplifier.

26. The circuit according to claim 25 further comprising means for initializing the voltage.

27. The circuit according to claim 25 further comprising means for sensing a level of the voltage wherein the means for controlling controls the level of the current according to the level of the voltage.

28. The circuit according to claim 26 further comprising means for sensing a level of the voltage wherein the means for controlling controls the level of the current according to the level of the voltage.

29. The circuit according to claim 25 wherein the means for controlling a level of the current forms a biasing signal having two levels wherein the biasing signal is at a first level when the voltage on the means for integrating is below a predetermined level and the biasing signal is at a second level when the voltage on the means for integrating is above the predetermined level and wherein the level of the current formed by the transconductance amplifier is responsive to the biasing signal.

30. The circuit according to claim 29 wherein at least one of the two levels is adjusted according to a level of a supply voltage.

31. The circuit according to claim 29 further comprising means for initializing the voltage.

* * * * *

UNITED STATES PATENT AND TRADEMARK OFFICE
CERTIFICATE OF CORRECTION

PATENT NO. : 5,825,223

DATED : October 20, 1998

INVENTOR(S) : Urs H. Mader

It is certified that error appears in the above-identified patent and that said Letters Patent is hereby correct as shown below:

The Title page, should be deleted to be replaced with the attached Title page.

IN THE DRAWINGS

Replace Figure 1b, on drawing sheet 2 of 5, with the attached drawing sheet which shows the correct between "CTLO" at pin to the drain FET 363.

United States Patent [19]

Mader

[11] Patent Number: 5,825,223
[45] Date of Patent: Oct. 20, 1998

[54] TECHNIQUE FOR CONTROLLING THE SLOPE OF A PERIODIC WAVEFORM

[75] Inventor: Urs H. Mader, Sunnyvale, Calif.

[73] Assignee: Micro Linear Corporation, San Jose, Calif.

[21] Appl. No.: 688,375

[22] Filed: Jul. 30, 1996

[51] Int. Cl.$^6$ .................................................. H03K 5/123
[52] U.S. Cl. .................. 327/170; 3327/134; 3327/336; 3327/345
[58] Field of Search ........................ 327/126, 127, 327/131, 132, 134–137, 170, 336, 345, 91, 94, 96

[56] References Cited

U.S. PATENT DOCUMENTS

| | | | |
|---|---|---|---|
| 3,671,782 | 6/1972 | Witlinger et al. | 327/96 |
| 3,723,891 | 3/1973 | Whiteley | 329/103 |
| 3,828,203 | 8/1974 | Belson et al. | 327/137 |
| 3,893,036 | 7/1975 | Cavoretto et al. | 327/136 |
| 4,031,449 | 6/1977 | Trombly | 320/2 |
| 4,038,625 | 7/1977 | Tompkins et al. | 336/83 |
| 4,063,108 | 12/1977 | Klett et al. | 307/64 |
| 4,127,795 | 11/1978 | Knoll | 315/210 |
| 4,144,462 | 3/1979 | Sieron et al. | 307/66 |
| 4,145,592 | 3/1979 | Mizukawa et al. | 219/10.49 R |
| 4,146,857 | 3/1979 | Schleupen | 336/61 |
| 4,172,981 | 10/1979 | Smith | 307/66 |
| 4,207,498 | 6/1980 | Spira et al. | 315/97 |
| 4,210,846 | 7/1980 | Capewell et al. | 315/121 |
| 4,225,825 | 9/1980 | Watts | 327/135 |
| 4,251,752 | 2/1981 | Stolz | 315/206 |
| 4,260,943 | 4/1981 | Zaderej et al. | 320/21 |
| 4,277,726 | 7/1981 | Burke | 315/98 |
| 4,277,728 | 7/1981 | Stevens | 315/307 |
| 4,297,614 | 10/1981 | Chandler | 315/86 |
| 4,303,902 | 12/1981 | Lesster et al. | 336/83 |
| 4,318,608 | 3/1982 | Payne | 355/3 CH |
| 4,390,844 | 6/1983 | Ting | 327/345 |
| 4,412,265 | 10/1983 | Buuck | 361/18 |
| 4,414,493 | 11/1983 | Henrich | 315/308 |
| 4,441,053 | 4/1984 | Daspit | 315/206 |
| 4,441,054 | 4/1984 | Bay | 315/219 |
| 4,453,109 | 6/1984 | Stupp et al. | 315/219 |
| 4,486,689 | 12/1984 | Davis et al. | 315/92 |
| 4,495,446 | 1/1985 | Brown et al. | 315/206 |
| 4,496,896 | 1/1985 | Melocik et al. | 320/2 |
| 4,498,031 | 2/1985 | Stupp et al. | 315/307 |
| 4,523,131 | 6/1985 | Zansky | 315/307 |
| 4,528,482 | 7/1985 | Merlo | 315/291 |

(List continued on next page.)

OTHER PUBLICATIONS

Micro Linear, "Applications Note 24", p. 3.
Micro Linear, "Advance Information ML–4830 Electronic Ballast Controller", Jun. 1992.
Micro Linear, "Advance Information ML–4830 Electronic Ballast Controller", Jul. 1992.

*Primary Examiner*—Toan Tran
*Attorney, Agent, or Firm*—Haverstock & Owens LLP

[57] ABSTRACT

A circuit for forming a substantially periodic signal having a linear relationship between amplitude and time over a portion of its period, wherein a slope in the linear portion is controllable. A transconductance amplifier has a gain which is controllable depending upon a level of biasing current. A capacitor is coupled to an output of the transconductance amplifier wherein a voltage level on the capacitor defines the periodic waveform. Logic signals coupled to inputs to the transconductance amplifier control a direction of current flow from the transconductance amplifier to charge and discharge the capacitor. The biasing current is controllable to control a slope of the periodic waveform. In the preferred embodiment, the invention is used in conjunction with a circuit for forming pulses centered about positive zero crossings of a sinusoidal signal. The biasing current to the transconductance amplifier has two components. A first component of the biasing current is constantly supplied and a second component of the biasing current is selectively supplied. Therefore, the slope of the waveform may have one of two values depending upon whether or not the second component of the biasing current is selected to increase the biasing current of the transconductance amplifier.

31 Claims, 5 Drawing Sheets

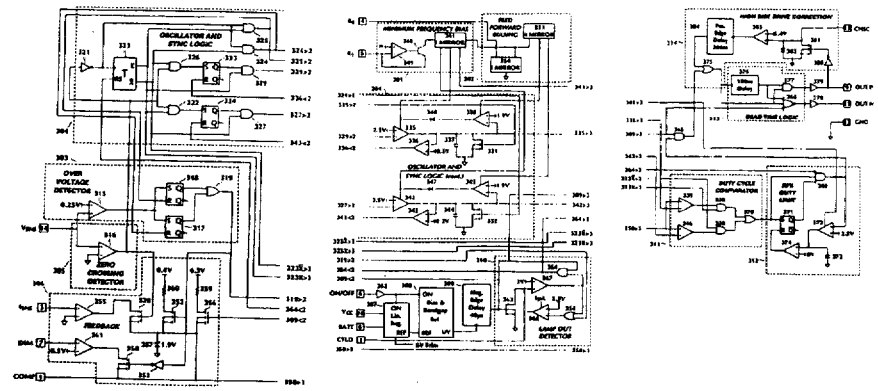

UNITED STATES PATENT AND TRADEMARK OFFICE
CERTIFICATE OF CORRECTION

PATENT NO. : 5,825,223

DATED : October 20, 1998

INVENTOR(S) : Urs H. Mader

It is certified that an error appears in the above-identified patent and that said Letters Patent is hereby corrected as shown below:

In the References Cited, add the following:

U.S PATENT DOCUMENTS

| | | | |
|---|---|---|---|
| 4,030,058 | 6/1977  | Riffe, et al.    | 336/92  |
| 3,953,768 | 4/1976  | Meredith, et al. | 317/31  |
| 3,921,005 | 11/1975 | Watrous          | 307/64  |
| 3,840,795 | 10/1974 | Roszyk, et al.   | 320/2   |
| 3,778,677 | 12/1973 | Kriege           | 315/219 |
| 3,772,625 | 11/1973 | Raupach          | 336/94  |
| 3,758,823 | 9/1973  | Jett, et al.     | 315/219 |
| 3,611,021 | 10/1971 | Wallace          | 315/239 |
| 3,549,990 | 12/1970 | Hochheiser       | 323/44  |
| 3,292,579 | 12/1966 | Buchanan         | 119/5   |
| 2,967,267 | 1/1961  | Steinman, et al. | 317/101 |
| 2,483,815 | 10/1949 | Easton           | 175/356 |

UNITED STATES PATENT AND TRADEMARK OFFICE
CERTIFICATE OF CORRECTION

PATENT NO. : 5,825,223

DATED : October 20, 1998

INVENTOR(S) : Urs H. Mader

It is certified that an error appears in the above-identified patent and that said Letters Patent is hereby corrected as shown below:

In the References Cited, add the following:

FOREIGN PATENT DOCUMENTS

| | | | |
|---|---|---|---|
| 9201334 | 1/1992 | World Patent Office | 3/281 |
| 0 178 852 | 4/1986 | European Patent Office | 41/26 |
| 0 059 064 | 9/1982 | European Patent Office | 41/392 |
| 34 32 266 A1 | 3/1985 | Germany | 41/26 |
| 32 33 655 A1 | 5/1983 | Germany | 41/29 |

UNITED STATES PATENT AND TRADEMARK OFFICE
CERTIFICATE OF CORRECTION

PATENT NO. : 5,825,223

DATED : October 20, 1998

INVENTOR(S) : Urs H. Mader

It is certified that an error appears in the above-identified patent and that said Letters Patent is hereby corrected as shown below:

In the References Cited, add the following:

OTHER PUBLICATIONS

J. Williams, "Techniques for 92% Efficient LCD Illumination" Linear Technology Application Note 55, pp. 1-43, August 1993.

Micro Linear, "ML4874 LCD Backlight Lamp Driver," pp. 1-6, April 1994.

Micro Linear, "ML4876 LCD Backlight Lamp Driver with Contrast," pp. 1-6, April 1994.

U. Mader, et al., Micro Linear, "Application Note 26 - Power Conversion Efficiencies for Miniature Fluorescent Lamp," pp. 1-6, February 1994.

K. Kit Sum, et al., Micro Linear, "Application Note 32 - Theory and Application of the ML4874 and ML4876 LCD Backlight Controller ICs," pp. 1-12, June 1994.

J. J. LoCascio and U. H. Mader, " A New Control Technique Uses 25% Less Power To Drive Miniature Cold Cathode Fluorescent Lamps," Electronic Ballast, pp. 60-69, April 1994.

M. Jordan and J.A. O'Connor, "Resonant Fluorescent Lamp Converter Provides Efficient and Compact Solution," IEEE, pp. 424-431, 1993.

Maxim Integrated Products, "CCFT Backlight and LCD Contrast Controllers - MAX753/MAX754," pp. 1-12, February 1994.

UNITED STATES PATENT AND TRADEMARK OFFICE
CERTIFICATE OF CORRECTION

PATENT NO. : 5,825,223

DATED : October 20, 1998

INVENTOR(S) : Urs H. Mader

It is certified that an error appears in the above-identified patent and that said Letters Patent is hereby corrected as shown below:

In the References Cited, add the following:

OTHER PUBLICATIONS

K. Kit Sum, Micro Linear, "ML4874 Evaluation Kit User's Guide - LCD Backlight Lamp Driver," pp. 1-5, April 1994.

Micro Linear, "ML4864 Evaluation User's Guide - LCD Backlight Lamp Driver with Contrast Control," pp. 1-4, January 1994.

Micro Linear, "ML4864 LCD Backlight Lamp Driver with Contrast Control," pp. 1-6, November 1993.

Signed and Sealed this

Twenty-fifth Day of July, 2000

Attest:

*Attesting Officer*

Q. TODD DICKINSON

*Director of Patents and Trademarks*